(12) United States Patent
Mills

(10) Patent No.: US 7,092,464 B2
(45) Date of Patent: Aug. 15, 2006

(54) MULTIUSER DETECTION WITH TARGETED ERROR CORRECTION CODING

(75) Inventor: Diane G Mills, Wilmington, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 142 days.

(21) Appl. No.: 10/863,081

(22) Filed: Jun. 8, 2004

(65) Prior Publication Data

US 2004/0234007 A1 Nov. 25, 2004

Related U.S. Application Data

(63) Continuation-in-part of application No. 10/818,536, filed on Apr. 5, 2004, now Pat. No. 6,967,598, and a continuation-in-part of application No. 10/678,203, filed on Oct. 3, 2003, now Pat. No. 6,831,574, and a continuation-in-part of application No. 10/134,330, filed on Apr. 29, 2002, now Pat. No. 6,981,203, and a continuation-in-part of application No. 10/120,955, filed on Apr. 11, 2002, now Pat. No. 6,947,506, and a continuation-in-part of application No. 10/055,155, filed on Jan. 23, 2002, now Pat. No. 6,839,390.

(51) Int. Cl.
*H03J 1/04* (2006.01)
(52) U.S. Cl. ...................................... 375/346
(58) Field of Classification Search ................ 375/341, 375/224, 265, 136, 346, 340, 262; 714/786, 714/759, 791, 793, 797
See application file for complete search history.

(56) References Cited

U.S. PATENT DOCUMENTS

| | | | |
|---|---|---|---|
| 5,790,606 A * | 8/1998 | Dent .......................... | 375/348 |
| 5,982,813 A * | 11/1999 | Dutta et al. ................. | 375/219 |
| 6,023,783 A | 2/2000 | Divsalar et al. | |
| 6,028,897 A | 2/2000 | Wang | |
| 6,029,264 A | 2/2000 | Kobayashi et al. | |
| 6,122,269 A * | 9/2000 | Wales ......................... | 370/338 |
| 6,166,667 A | 12/2000 | Park | |
| 6,182,261 B1 | 1/2001 | Haller et al. | |
| 6,198,775 B1 * | 3/2001 | Khayrallah et al. ......... | 375/265 |
| 6,219,341 B1 * | 4/2001 | Varanasi ..................... | 370/252 |
| 6,240,099 B1 * | 5/2001 | Lim et al. ................... | 370/441 |
| 6,298,461 B1 | 10/2001 | Tong et al. | |

(Continued)

OTHER PUBLICATIONS

Alexander, Paul D. et al., "Iterative Multiuser Interference Reduction: Turbo CDMA", IEEE Transactions on Communications, Jul. 1999, pp. 1008-1014, vol. 47 No. 7.

(Continued)

*Primary Examiner*—Emmanuel Bayard
(74) *Attorney, Agent, or Firm*—Maine & Asmus

(57) ABSTRACT

An error correction decoding (ECC) processing scheme is disclosed that reduces computational complexity normally associated with multiuser detection (e.g., TurboMUD) solutions, without causing degradation in quality of service or decreasing the total throughput. Error correction decoding algorithms are applied only to portions of the estimates that were affected by the immediately previous MUD update process. Even though the MUD and/or ECC updating is targeted so as to reduce complexity of each iteration, all of the estimates are maintained and remain candidates for future updates. As such, there is no negative impact real-time or future performance. This targeting approach can be used in conjunction with many variations of MUD, including full-complexity or reduced complexity, and may include MUD with confidence ordering or voting, and other techniques for facilitating efficient and effective MUD processing.

30 Claims, 5 Drawing Sheets

U.S. PATENT DOCUMENTS

| | | | |
|---|---|---|---|
| 6,392,572 | B1 | 5/2002 | Shiu et al. |
| 6,397,367 | B1 | 5/2002 | Park et al. |
| 6,430,722 | B1 | 8/2002 | Eroz et al. |
| 6,499,128 | B1 | 12/2002 | Gerlach et al. |
| 6,510,536 | B1 | 1/2003 | Crozier et al. |
| 6,529,559 | B1 | 3/2003 | Reshef |
| 6,570,919 | B1 | 5/2003 | Lee |
| 6,611,513 | B1 | 8/2003 | ten Brink |
| 6,704,376 | B1 | 3/2004 | Learned et al. |
| 2001/0021233 | A1 | 9/2001 | Jin |
| 2001/0025358 | A1 | 9/2001 | Eidson et al. |
| 2002/0007474 | A1 | 1/2002 | Fujita et al. |
| 2002/0057730 | A1* | 5/2002 | Karlsson et al. ............. 375/152 |
| 2002/0146044 | A1* | 10/2002 | Esmailzadeh et al. ....... 370/542 |
| 2002/0172166 | A1* | 11/2002 | Arslan et al. ................ 370/317 |
| 2002/0184173 | A1 | 12/2002 | Olivier |
| 2002/0191577 | A1 | 12/2002 | Pan et al. |
| 2003/0026357 | A1 | 2/2003 | Bartlett et al. |
| 2003/0138035 | A1 | 7/2003 | Mills |
| 2003/0138065 | A1 | 7/2003 | Mills et al. |
| 2003/0182369 | A1 | 9/2003 | MacLeod |
| 2003/0193966 | A1 | 10/2003 | Mills |
| 2003/0198303 | A1 | 10/2003 | Taylor et al. |
| 2003/0204808 | A1 | 10/2003 | Mills |
| 2004/0017863 | A1 | 1/2004 | Learned |
| 2004/0100897 | A1* | 5/2004 | Shattil ......................... 370/206 |

OTHER PUBLICATIONS

Poor H. Vincent, "Turbo Multiuser Detection: An Overview", IEEE 6th Int. Symp on Spread-Spectrum Tech. & Appli., Sep. 6-8, 2000 pp. 583-587, NJIT, New Jersey.

Wang, Xiaodong, et al., "Iterative (Turbo) Soft Interference Cancellation and Decoding for Coded CDMA", IEEE Transactions on Communications, Jul. 1999, pp. 1046-1061, vol. 47 No. 7.

Das, Suman et al., "Computationally Efficient Iterative Multiuser Detection and Decoding", IEEE, 1998, pp. 631-635.

Herzog, Rupert et al., "Iterative Decoding and Despreading improves CDMA-Systems using M-ary Othogonal Modulation and FEC", IEEE, 1997, pp. 909-913.

Robertson, Patrick, A et al., "Comparison of Optimal and Sub-Optimal MAP Decoding Algorithms Operating in the Log Domain", IEEE, 1995, pp. 1009-1013.

Hagenauer, Joachim et al., "A Viterbi Algorithm with Soft-Decision Outputs and its Applications", IEEE, 1989, pp. 1680-1686.

Pottie, Gregory J. et al., "A Comparison of Reduced Complexity Decoding Algorithms for Trellis Codes", IEEE Journal On Selected Areas In Communication, Dec. 1989, pp. 1369-1380, vol. 7 No. 9.

Berrou, Claude et al., "Near Shannon Limit Error- Correcting Coding and Decoding: Turbo-Codes", IEEE 1993, pp. 1064-1070.

Berrou, Claude et al., "Near Optimum Error Correcting Coding and Decoding: Turbo-Codes", IEEE Transactions on Communication, Oct. 1996, pp. 1261-1271, vol. 44 No. 10.

Wang, Duanyi et al., "Low-Complexity MAP Decoding for Turbo Codes", IEEE, 2000, pp. 1035-1039.

Benedetto, Sergio et al., "Analysis, Design, and Iterative Decoding of Double Serially Concatenated Codes with Interleavers", IEEE Journal on Selected Ares in Communications, Feb. 1998, pp. 231-244, vol. 16 No. 2.

Jin, Hui et al., "Coding Theorems for Turbo Code Ensembles", Was to be submitted to IEEE Trans. Inform. Theory, Jan. 2001, pp. 1-25.

Moher, Michael, "An Iterative Multiuser Decoder for Near-Capacity Communications", IEEE Transactions on Communications, Jul. 1998, pp. 870-880, vol. 46, No. 7.

Reed, Mark C et at., "Reduced Complexity Iterative Multi-User Detection for DS/CDMA with FEC", pp. 1-5.

Reed, Mark C. et al., "Near Single User Performance using Iterative Multi-User Detection for CDMA with Turbo-Code Decoders", pp. 1-5.

Forney, David G., Jr., "Concatenated Codes", Technical Report, Dec. 1, 1965, pp. 115 total.

Zhenning, Shi et al. "Asymptotic iterative multi-user detection of random CDMA", IEEE International Symposium on Information Theory, Proceedings, Jul. 5, 2002, p. 447.

Verdu, S., "Nondecorrelating Linear Multiuser Detection", 1998, pp. 288-298, Cambridge University Press.

Wang, Xiaodong et al., "Turbo Multiuser Detection For Turbo-Coded CDMA", IEEE, 1999, pp. 1456-1460.

* cited by examiner

MULTIUSER DETECTION WITH TARGETED ERROR CORRECTION CODING

RELATED APPLICATIONS

This application is a continuation-in-part of Ser. No. 10/055,155 now U.S. Pat. No. 6,839,390, filed 23 Jan, 2002. This application is also a continuation-in-part of Ser. No. 10/120,955 now U.S. Pat. No. 6,947,506, filed 11 Apr. 2002. This application is also a continuation-in-part of Ser. No. 10/134,330 now U.S. Pat. No. 6,981,203, filed 29 Apr. 2002. This application is also a continuation-in-part of Ser. No. 10/678,203 now U.S. Pat. No. 6,831,574, filed 3 Oct. 2003. This application is also a continuation-in-part of Ser. No. 10/818,536 now U.S. Pat. No. 6,967,598, filed 5 Apr. 2004. Each of these applications is herein incorporated in its entirety by reference.

FIELD OF THE INVENTION

The invention relates to communications, and more particularly, to multiuser detection (MUD) with targeted error correction coding (ECC).

BACKGROUND OF THE INVENTION

Wireless networks are employed for communication between various devices, such as cell phones and computers. Digitally modulated signals such as binary phase shift keyed and quadrature phase shift keyed signals are transmitted between nodes of the network. Examples include satellite communications networks where terminals transmit through satellite transponders, terrestrial systems where terminals transmit through repeating towers, and indoor local area networks where terminals transmit through central repeating elements.

Computer elements connected to these networks provide a variety of user services. Examples include telephone traffic with digital voice encoding, video conferencing, local and wide area computer network connectivity, and internet service. In such applications, it is desirable to maximize the network traffic capacity in a given bandwidth in the presence of interference and noise. To that end, a variety of modulation and coding schemes exist for efficiently partitioning the network elements into communication channels.

For example, frequency domain multiple access (FDMA) schemes assign each network terminal to a separate, non-overlapping frequency band. Time domain multiple access (TDMA) schemes assign each terminal to a separate non-overlapping time slot. Code division multiple access (CDMA) schemes assign each terminal to a separate modulating waveform so that the cross correlation between each terminal is negligible. Orthogonal frequency division multiplexing (OFDM) schemes break up a single wideband channel into many narrowband channels. Each channel transmits a small piece of information on a different sub-carrier that together with the other channels comprises a larger block of information for a single user. The bands are selected so adjacent bands do not interfere with each other.

New, emerging wireless networking systems based on OFDM, networking standard 802.11, and multicarrier code division multiple access (MC-CDMA) are increasing in popularity. As such networks increase the potential for performance degradation due to multiuser interference (sometimes referred to as multiaccess interference) when the systems are operating simultaneously in the same frequency band with similar modulation and spreading methods.

More specifically, a real world multiuser system includes a number of independent users simultaneously transmitting signals. Each of these transmissions are associated with real-time problems of multipath and multiuser interference that manifest in each of the received signals. Multipath occurs when a signal proceeds to its intended receiver along not one but many paths so that the receiver encounters echoes having different and randomly varying delays and amplitudes.

A multiuser detection (MUD) receiver can be used to jointly demodulate co-channel interfering digital signals. In general, MUD refers to the detection of data in non-orthogonal multiplexes. MUD processing increases the number of information bits available per chip or signaling dimension for interference limited systems. In some cases, the multiuser interference can be so severe that the signals are not detectable by conventional receiver processing techniques. Known receiver processing techniques include, for example, the use of: matched filters, without MUD; iterative Turbo-MUD, with either full-complexity (based on maximum likelihood principle) or reduced complexity (minimum mean square error, decorrelator, parallel interference cancellation, serial interference cancellation, and tree-pruned MUD); and partitioned MUD and error correction coding (ECC) techniques, where the MUD component can be full or reduced complexity.

The common problem associated with these receiver processing procedures is that they cannot be run in real-time and simultaneously operate at acceptable performance levels. For example, matched filters and partitioned MUD/ECC do not achieve acceptable bit error rate performance levels, particularly for highly loaded systems. In addition, some MUD/ECC solutions fail to address the exceptionally high complexity within the error correction decoding portion. TurboMUD, both full and reduced complexity approaches, encounters complexity increases as the number of iterations increases. In particular, single user decoders typically implement a BCJR algorithm, which is very computationally intensive.

What is needed, therefore, are techniques that reduce the complexity of MUD processing without negatively impacting real-time or future receiver performance.

BRIEF SUMMARY OF THE INVENTION

One embodiment of the present invention provides a method for performing real-time receiver processing in a multiple access system that has error correction coding enabled. The method includes receiving a block of signal data including an intended signal and one or more interfering signals for other users of the system. The method proceeds with generating reliability information using a multiuser interference mitigation algorithm (e.g., Turbo-MUD), where the reliability information includes confidence values for each user represented during the block. The method continues with comparing current confidence values for a user with previous confidence values for that user. In response to the comparison indicating a change in confidence values for the user does not exceed a threshold, the method continues with using previously decoded confidence values and corresponding bit estimates for that user, thereby reducing error correction coding complexity. Note that the method may further include repeating the comparing and using for each user represented during the block.

In response to the comparison indicating a change in confidence values for the user exceeds the threshold, the method may further continue with calculating updated decoded confidence values and corresponding bit estimates for the user using an error correction code. In one such embodiment, the method may further include updating the previously stored matrix of reliability information to include the updated decoded confidence values and the corresponding bit estimates. In another such embodiment, the method may further include recombining the updated decoded confidence values and previously decoded confidence values into their original order, and recombining the updated decoded bit estimates and previously decoded bit estimates into their original order, thereby providing combined confidence values and combined bit estimates. In this case, and in response to no further iteration being required, the method may further include providing the combined bit estimates as final estimates. The method can be repeated for one or more additional blocks of signal data. In another case, and in response to further iteration being required, the method may further include subjecting the combined confidence values to additional processing through the multiuser interference mitigation algorithm. The method can repeat, for example, until a rule of iteration is satisfied. Note, however, that in other embodiments, there is no iteration through the multiuser interference mitigation algorithm.

The method may further include other processing steps, such as estimating relative parameters for each of the interfering signals present in the received signal, thereby providing a matrix of estimated composite signature waveforms for each user to the multiuser interference mitigation algorithm; filtering the estimated composite signature waveforms to facilitate distinguishing between the interfering signals by the multiuser interference mitigation algorithm; and interleaving and de-interleaving based on a transmitter-based interleaving scheme. The method may further include storing the matrix of reliability information and corresponding bit estimates for use in future operations. In one particular embodiment, the multiuser interference mitigation algorithm is a reduced complexity multiuser detection (MUD) algorithm. In another embodiment, the multiuser interference mitigation algorithm is a MUD algorithm that operates in conjunction with at least one of interleaving, confidence ordering, and voting schemes to reduce MUD processing complexity.

Another embodiment of the present invention provides a system for performing real-time receiver processing in a multiple access system that has error correction coding enabled. The system includes a multiuser interference mitigation module configured for generating reliability information that includes confidence values for each user represented during a block of received signal data. The received signal data includes an intended signal and one or more interfering signals for other users of the system. A sorting module is adapted for comparing current confidence values for a user with previous confidence values for that user. In response to the comparison indicating a change in confidence values for the user does not exceed a threshold, previously decoded confidence values and corresponding bit estimates are used for the user, thereby reducing error correction coding complexity. In response to the comparison indicating a change in confidence values for the user exceeds the threshold, updated decoded confidence values and corresponding bit estimates can be calculated for the user using an error correction code.

The system may further include a recombining module that is adapted for recombining the updated decoded confidence values and previously decoded confidence values into their original order, and recombining the updated decoded bit estimates and previously decoded bit estimates into their original order, thereby providing combined confidence values and combined bit estimates. In this case, and in response to no further iteration being required, the recombining module can be further adapted to provide the combined bit estimates as final estimates. In response to further iteration being required the recombining module can be further adapted to provide the combined confidence values to the multiuser interference mitigation module for additional processing until a rule of iteration is satisfied. In other embodiments of the system, however, there is no iteration through the multiuser interference mitigation module.

Other components of the system may include, for example, a parameter estimating module that is adapted for estimating relative parameters for each of the interfering signals present in the received signal, thereby providing a matrix of estimated composite signature waveforms for each user to the multiuser interference mitigation module; a filter for filtering the estimated composite signature waveforms to facilitate distinguishing between the interfering signals by the multiuser interference mitigation module; an interleaver module for interleaving signals provided to the multiuser interference mitigation module based on a transmitter-based interleaving scheme; and a de-interleaver module for de-interleaving signals from the multiuser interference mitigation module based on the transmitter-based interleaving scheme. The system may further include a storage module for storing at least one of reliability information and corresponding bit estimates. The multiuser interference mitigation module can be, for example, a reduced complexity multiuser detection (MUD) module or a MUD module that operates in conjunction with at least one of interleaving, confidence ordering, and voting schemes to reduce MUD processing complexity.

Another embodiment of the present invention provides a processor readable medium containing processor-executable instructions for performing real-time receiver processing in a multiple access system that has error correction coding enabled. The processor-executable instructions include instructions for: receiving reliability information generated by a multiuser interference mitigation module, the reliability information including confidence values for each user represented during a block of received signal data including an intended signal and one or more interfering signals for other users of the system; comparing current confidence values for a user with previous confidence values for that user; and in response to the comparison indicating a change in confidence values for the user does not exceed a threshold, using previously decoded confidence values and corresponding bit estimates for that user, thereby reducing error correction coding complexity. In response to the comparison indicating a change in confidence values for the user exceeds the threshold, the processor-executable instructions may further include instructions for: calculating updated decoded confidence values and corresponding bit estimates for the user using an error correction code; recombining the updated decoded confidence values and previously decoded confidence values into their original order, and recombining the updated decoded bit estimates and previously decoded bit estimates into their original order, thereby providing combined confidence values and combined bit estimates; and in response to no further iteration being required, providing the combined bit estimates as final estimates.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 1b illustrates a block diagram showing an unwrapped layout of the TurboMUD processing element of FIG. 1a.

DETAILED DESCRIPTION OF THE INVENTION

Figure 1A:
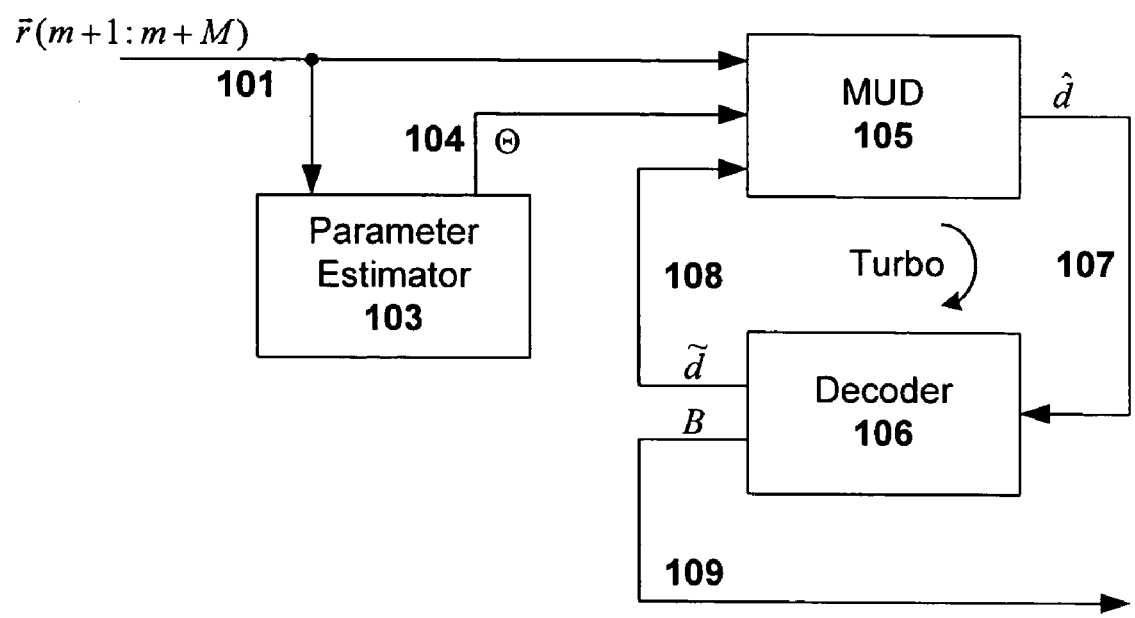
FIG. 1a illustrates a functional block diagram of a TurboMUD processing element that can be configured in accordance with the principles of the present invention.

Embodiments of the present invention provide a multiuser detection (MUD) and error correction decoding (ECC) processing scheme that reduces computational complexity normally associated with MUD, TurboMUD and reduced complexity MUD/TurboMUD solutions, without causing degradation in quality of service or decreasing the total throughput. Thus, high quality real-time receiver processing for overloaded multiple access systems that have error correction codes is enabled, as well as reductions in receiver energy consumption, receiver processing time, receiver hardware costs, and receiver size and weight.

In general, multiuser detection and error correction decoding algorithms are iteratively applied only to portions of the estimates that were affected by the immediately previous update process. Even though the updating is targeted so as to reduce complexity of each iteration, all of the estimates are maintained and remain candidates for future updates. As such, there is no negative impact on-going/real-time or future performance. This "targeting" approach can be used in conjunction with many variations of MUD and TurboMUD, as will be apparent in light of this disclosure. For instance, the MUD component can be full-complexity or reduced complexity, and may include MUD with confidence ordering or voting, and other techniques for facilitating efficient and effective MUD processing.

The improved performance and low complexity afforded by embodiments of the present invention will allow service providers to use more active transmitters (e.g., paying customers, users, phones, devices, etc.) without requiring more bandwidth or compromising performance. In addition, note that the techniques described herein may be used to replace existing TurboMUD, MUD, or standard receivers without any modification to the transmitters, thereby allowing service providers to offer improved performance without changing existing signaling methods. In addition, modifications to existing MUD receiver architectures for implementing the principles of the present invention are minimal, including minimal impact on hardware requirements. Depending on the hardware architecture used, for example, the modification can simply be a software modification/upgrade.

Applications other than communication systems can also employ MUD technology embodying the present invention, such as data storage applications, where a MUD receiver is operatively coupled to the read heads of the storage device (e.g., disk drive), thereby enabling the reading of multiple tracks and the removal of interference from neighboring tracks. One such application is described in U.S. application Ser. No. 10/497557, filed Jun. 3, 2004, titled "Multitrack Readback and Multiuser Detection for Disk Drives", which is a continuation-in-part of U.S. application Ser. No. 10/251,187, filed Sep. 20, 2002, and titled "Multichannel Digital Recording System with Multi-User Detection." Each of these applications is herein incorporated in its entirety by reference.

Multiuser Detection Overview

Figure 1B:
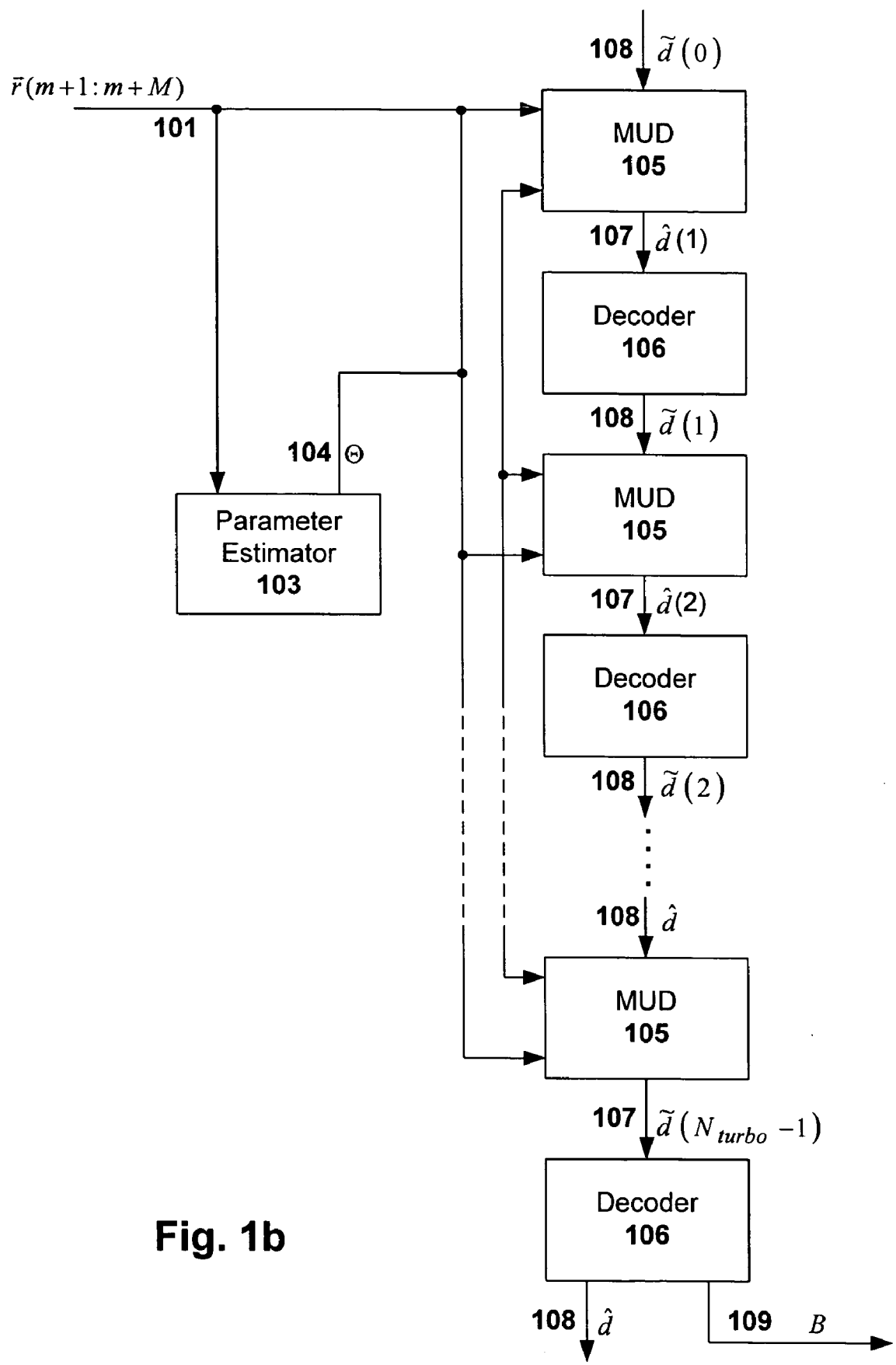

FIG. 1a illustrates the basic layout of a TurboMUD processing element, while FIG. 1b illustrates a more detailed block diagram showing the full unwrapped layout of a TurboMUD processing element. These figures are used to explain how a MUD receiver works, and in particular, an iterative TurboMUD receiver.

As can be seen in FIG. 1a, a frame of data $\bar{r}(m+1:m+M)$ on path 101 is provided to the TurboMUD processing element. This is a vector of M samples of data, offset m samples into the received data stream. This data is made available to both the parameter estimation module 103 and the MUD module 105. In the alternate notation of FIG. 1b, it can be seen that for TurboMUD, several copies of the MUD module 105 are implied, one for each of $N_{turbo}$ turbo iterations. FIG. 1a is a shorthand notation for describing this iterative MUD process.

Note that each of the MUD modules 105 shown in FIG. 1b is not run in parallel. Rather each one is run in turn as the three inputs to each are made valid. The same physical hardware can be used to implement each module, where one module 105 repeats the same process for each iteration, using the appropriate inputs for the current iteration. The three inputs to each MUD module 105 are the data on path 101 (always valid), parameters Θ on path 104 (simultaneously available and valid to all MUD modules 105 as soon as module 103 parameter estimation is completed), and the previously decoded symbols $\tilde{d}(t)$ on path 108. The previously determined a priori symbol estimates, or confidence values, $\tilde{d}(t)$ 108 are not made valid until they have been either initiated, or one of the decoding modules 106 has computed them. Note that these previously estimated symbol $\tilde{d}(t)$ 108 are actually a matrix of symbols, by K users by $N_{symbols}$ in dimension.

The number of symbols in a frame of data is related to the number of bits in a frame and the modulation scheme. For example, for a half rate code and BPSK modulation, there would be $N_{symbols}=2*L$ symbols in a frame for each user, where L is the number of data bits in the frame for each user, prior to encoding. Each of these matrices of symbols $\tilde{d}(t)$ 108 corresponds uniquely to some matrix B of decoded bits, but these bits are not required by the TurboMUD, and as such are not shown as being passed back and forth in the turbo loop. At the last decode stage, however, the matrix B of decoded bits is computed and passed out of the algorithm of a particular TurboMUD process, as the final determination of the bit values for the frame.

An example TurboMUD process that can be used in accordance with the principles of the present invention proceeds as follows, with reference to FIGS. 1a and 1b. The process begins with copying or otherwise providing data $\bar{r}(m+1:m+M)$ to path 101, thereby making that data available to the MUD module 105 and the parameter estimator module 103. The process proceeds with computing parameter estimates Θ 104 (with parameter estimator 103), and making those estimates available to the MUD module 105.

The process continues with initializing symbol a priori (confidence) values â(0) 108 to an 'undecided' state, making those symbols valid. The process continues with computing the first estimates of the symbols â(1) (with MUD 105) using data r̄(m+1:m+M), Θ, and â(0), and outputting that result on path 107. The process continues with computing the a priori values for the next iteration â(2) (with decoder 106) using â(1), and outputting that result on path 108 (declare valid). Note that at this time, the decoded bits B are not written onto path 109. The process continues with computing â(2) (with MUD 105) using r̄(m+1:m+M), Θ, and â(2), and outputting that result on path 107.

Indexing through the process accordingly, the process continues with computing â(3) (with decode 106) using â(2), and outputting that result on path 108 (declare valid). Note that at this time, the decoded bits B are not written onto path 109. The process continues with computing â(3) (with MUD 105) using r̄(m+1:m+M), Θ, and â(3), and outputting that result on path 107. This computing of decoding and MUD is repeated, indexing appropriately. For the last iteration of the turbo loop, the process continues with computing decode 106 using â($N_{turbo}-1$), and writing the resulting decoded bits B onto path 109.

The parameter estimation module 103, MUD module 105, and decoder module 106 can be implemented in conventional technology, but numerous variations will be apparent in light of this disclosure. The targeting architecture and functionality in accordance with the principles of the present invention are discussed in more detail with reference to FIGS. 2 and 3.

Targeted MUD and ECC Architecture

Figure 2:
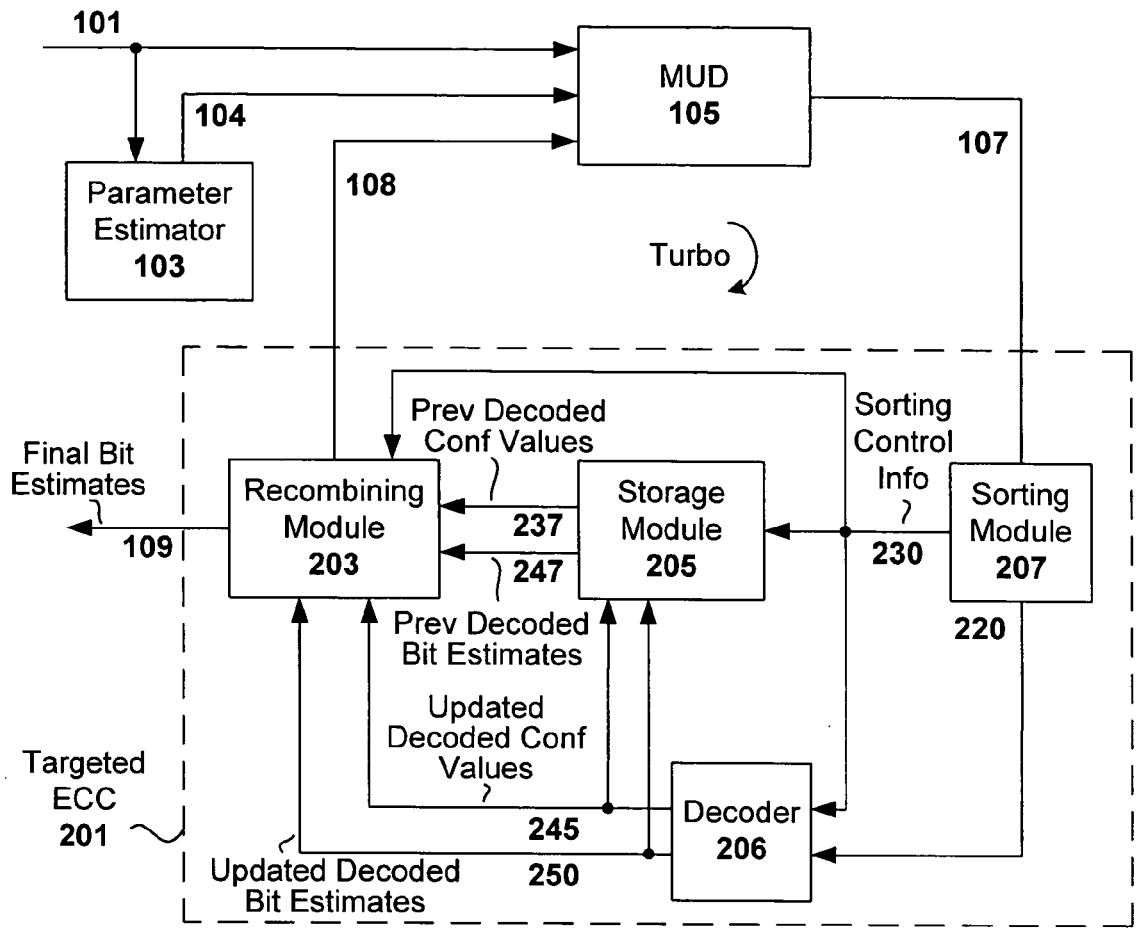
FIG. 2 illustrates a block diagram of a targeted MUD/ECC receiver configured in accordance with an embodiment of the present invention.

FIG. 2 illustrates a block diagram of a MUD receiver configured with targeted ECC in accordance with an embodiment of the present invention. The receiver allows for "targeting" the ECC processing to only particular users, while retaining the estimates of all users for future potential MUD and ECC estimate updates. Note that both iterative and non-iterative embodiments are possible here. The iterative embodiment is described herein, but it will be appreciated that the non-iterative embodiment runs a single cycle through the process.

As can be seen, the receiver includes a parameter estimator module 103, a MUD module 105 and a targeted ECC module 201, which includes a recombining module 203, a single user storage module 205, a bank of single user decoders 206, and a sorting module 207. In a TurboMUD system, decoding and confidence information is passed between the MUD module 105 and the bank of single-user decoders 206. Maximum a posteriori probability (MAP) decoders (or approximations of MAP decoders) can be used for both the MUD module 105 and the decoders 206 so that soft output information is available if desired. In this particular configuration, note that the targeting is implemented only in the ECC portion. However, as will be apparent in light of this disclosure, targeting may also be integrated into the MUD portion.

The parameter estimation module 103 estimates the relative received timing offsets, phases, received amplitudes, and multipath structure for each of the interfering signals present in the signal received on path 101. The result of such parameter estimation 103 is provided on path 104, and is a matrix (S) of estimated composite signature waveforms for each user, which is used by the MUD module 105 to help separate the channel signals. The parameter estimation module 103 can be implemented in conventional technology. However, variations will be apparent in light of this disclosure. For example, the parameter estimator 103 can be configured as described in U.S. patent application Ser. No. 10/228,787, filed 26 Aug. 2002 and titled, "Parameter Estimator for a Multiuser Detection Receiver." This application is herein incorporated in its entirety by reference.

Note that data from the parameter estimation module 103 can be passed to a filter (not shown), such as a whitening matched filter bank or bank of matched filters as conventionally done. A whitening filter tries to 'spread' or 'warp' the signal so that it is easier to distinguish between signals by changing the axes or point of reference. Recall that supersaturated or overloaded conditions occur when the number of users K exceeds the number of dimensions N. The number of dimensions is determined by the physical parameters of the communication system. Many parameter estimation and filtering techniques are available to handle overloaded conditions, and the present invention is readily adaptable to such other configurations.

The signal on path 104 represents the input data after parameter estimation and pre-filtering has been done. The resulting signal is then passed into a MUD module 105, which assumes knowledge of various parameters such as relative received timing offsets, carrier phase, frequency offsets, received amplitudes, and multipath structure for each of the interfering signals present in the received signal on path 101. In one embodiment, the MUD module 105 is a conventional full-complexity or "optimal" MAP detector. Alternatively, various "reduced complexity" MAP-based approaches can be used to implement MUD module 105. For example, MUD algorithms carried out by MUD module 105 may include conventional minimum mean squared error (MMSE), M-algorithm, T-algorithm, parallel interference cancellation (PIC), and many other available multiuser interference mitigation algorithms.

The MUD module 105 passes soft decisions in the form of reliability or confidence measures on line 107 to a sorting module 207. The reliability information may be thought of as a matrix of information, for which a row corresponds to the reliability values for a particular user over the symbol intervals represented during the frame, and for which a column corresponds to the reliability values for all users during one particular symbol interval.

The sorting module 207 compares the row of current confidence values for a user from line 107 with the appropriate row of previous confidence values for that user from the previous iteration and which were stored by the sorting module. If the change in values for a particular user exceeds a threshold, either on a per-element basis or across the row in aggregate, the sorting module 207 passes (via path 220) the row of confidence values to the corresponding single user decoder 206 for that user. In this sense, the corresponding single user decoder 206 is "active" for the current iteration. Note that the threshold may be either pre-determined or adaptively updated. The threshold can be based on any of a variety of parameters, and can be fixed or adaptive. For instance, the threshold can be based on the average change of elements within the row, the average percentage change, the maximum change for any one element in the row, the norm, or similar values. The sorting performed by sorting module 207 is done for all users. The sorting module 207 also provides sorting control information (via path 230). This sorting control information includes a list that tracks which users were passed to the "partially activated" bank of decoders 206, and which users do not undergo decoding on the current iteration (those users associated with "inactive" single user decoders in bank 206).

The sorting control information is passed on path 230 to the bank of single user decoders 206, the recombining module 203, and the storage module 205. The sorting module 207 saves the most recent information available on path 107 for use in future sorting operations. The single user storage module 205 retrieves previously calculated values of d̂ and b for the inactive single user decoders within module 206. Note that inactive decoders within 206 are the decoders for the users that the sorting module 207 determined should stay inactive for the present iteration.

For the inactive decoders in bank 206, the storage module 205 outputs the previously calculated conditional probabilities (also referred to as confidence values) and bit estimates for the appropriate users on paths 237 and 247. The activated single user decoders 206 calculate conditional probabilities, one for each decoded symbol of each user identified by the sorting module 207, and output those conditional probabilities as confidence values on path 245. Additionally, corresponding bit estimates are output on path 250. The single user decoders 206 can use any decoding algorithm that is suitable for the particular application of interest.

Acceptable decoder algorithms include, for example, soft-output Viterbi algorithm (SOVA) and MAP decoding algorithms and approximations of those approaches. Note that the set of activated decoders is likely to be different for each iteration. The updated conditional probabilities (confidence values) on path 245 and the updated bit estimates on path 250 are passed to the storage module 205 so that stored values are updated for potential use in the next iteration. The updated confidence values on path 245 and updated bit estimates on path 250 are also passed to the recombining module 203.

Recombining module 203 then recombines the updated confidence values (for active decoders 206) and the previous confidence values (for inactive decoders 206) into their original order, and recombines the updated bit estimates (for active decoders 206) and previous bit estimates (for inactive decoders 206), using the sorting control information provided by the sorting module 207 on path 230. If it has been determined that iterating is complete (based on an established rule of iteration), the recombining module 203 then outputs the combined bit estimates, one for each user and each bit interval, on path 109. This output represents the final bit estimates of what the user sent. Operation then commences for the next block of data, where the MUD and ECC processes are repeated as described herein.

Otherwise, if further iteration is required, then the recombining module 203 passes the combined conditional probabilities on path 108 to the MUD module 105 for further processing. The decision for further iteration can be based, for example, on a predetermined threshold for an iteration counter being reached, or on confidence value thresholds being reached, or on an asymptote being reached. Alternatively, the decision for further iteration can be done adaptively by checking if there were significant changes to the data from the last iteration. Other rules of iteration can be used here as well. Iteration continues as described until the stopping criteria is met, and then the final estimates are output on path 109, and processing begins for the next block of received data. Note that non-iterating embodiments would simply involve one pass through the MUD and ECC processing, with the final bit estimates provided on path 109 (no feedback to the MUD module 105 on path 108).

The targeting approach shown in FIG. 2 is applicable to a wide variety of configurations. For instance, the MUD module 105 can be replaced by the threshold, conditioning, MMSE-MUD and recombining processes as described in U.S. application Ser. No. 10/105,918, filed 25 Mar. 2002 and titled "System for Decreasing Processing Time in an Iterative Multi-User Detector System." Thus, modules 203, 205, 206 and 207 and the corresponding paths (e.g., 107, 108, and 109) in the "lower" part of the turbo loop shown in FIG. 2 herein would replace the "error correction unit 28" of U.S. application Ser. No. 10/105,918. This application is herein incorporated in its entirety by reference.

Similarly, modules 203, 205, 206 and 207 and the corresponding paths (e.g., 107, 108, and 109) in the "lower" part of the turbo loop shown in FIG. 2 herein, can replace the bank of single user decoders typically used in other iterative turboMUD and other MUD processors, such as decoder banks 220 or 340 shown in U.S. Pat. No. 6,704,376, titled "Power and Confidence Ordered Low Complexity Soft TurboMUD with Voting System." This patent is herein incorporated in its entirety by reference.

Another MUD processing technique that can be used in conjunction with MUD module 105 is described in previously incorporated U.S. Pat. No. 6,839,390, filed 23 Jan. 2002 and titled "Voting System for Improving the Performance of Single-User Decoders within an Iterative Multi-User Detection System." Here, modules 203, 205, 206 and 207 and the corresponding paths (e.g., 107, 108, and 109) in the "lower" part of the turbo loop shown in FIG. 2 herein would replace the bank of single user decoders 18 or the bank of decoders 42 respectively shown in FIGS. 1 and 2 of U.S. Pat. No. 6,839,390.

Another MUD processing technique that can be used in conjunction with MUD module 105 is described in previously incorporated U.S. Pat. No. 6,947,506, filed 11 Apr. 2002 and titled "Method and Apparatus for Improved Turbo Multiuser Detector." Here, modules 203, 205, 206 and 207 and the corresponding paths (e.g., 107, 108, and 109) in the "lower" part of the turbo loop shown in FIG. 2 herein would replace the bank of single user decoders 16 shown in each of FIGS. 1 and 2 of U.S. Pat. No. 6,947,506.

Another MUD processing technique that can be used in conjunction with MUD module 105 is described in previously incorporated U.S. Pat. No. 6,981,203, filed 29 Apr. 2002 and titled "Method and Apparatus for Random Shuffled Turbo Multiuser Detector." Here, modules 203, 205, 206 and 207 and the corresponding paths (e.g., 107, 108, and 109) in the "lower" part of the turbo loop shown in FIG. 2 herein would replace the bank of single user decoders 16 shown in each of FIGS. 1, 2 and 3 of U.S. application Ser. No. 10/134,330. Note that FIG. 3 of U.S. Pat. No. 6,981,203 shows a non-iterative approach (so there would be no feedback path 108 as shown in FIG. 2 of the present application).

Another MUD processing technique that can be used in conjunction with MUD module 105 is described in previously incorporated U.S. Pat. No. 6,831,574, filed 3 Oct. 2003 and titled "Multi-Turbo Multi-User Detector." Here, a first set of modules 203, 205, 206 and 207 and the corresponding paths (e.g., 107, 108, and 109) in the "lower" part of the turbo loop shown in FIG. 2 herein could replace the bank of single user decoders 230, and/or a second set of modules 203, 205, 206 and 207 and the corresponding paths could replace the bank of Reed-Solomon decoders 240, shown in FIGS. 2a and 2b of U.S. Pat. No. 6,831,574. Also, a first set of modules 203, 205, 206 and 207 and the corresponding paths could replace the bank of single user decoders 310, and/or a second set of modules 203, 205, 206 and 207 and the corresponding paths could replace the bank of Reed-Solomon decoders 320, shown in FIGS. 3a and 3b of U.S. Pat. No. 6,831,574. Also, and referring to FIG. 6a of U.S. Pat. No. 6,831,574, a first set of modules 203, 205, 206 and 207 and the corresponding paths (of FIG. 2 herein)

could replace the convolutional decoders 600, and/or a second set of modules 203, 205, 206 and 207 and the corresponding paths could replace the convolutional decoders 610. Also, and referring to FIG. 6b of U.S. Pat. No. 6,831,574, a first set of modules 203, 205, 206 and 207 and the corresponding paths (of FIG. 2 herein) could replace the block decoders 620, and/or a second set of modules 203, 205, 206 and 207 and the corresponding paths could replace the block decoders 630. Also, and referring to FIG. 7 of U.S. Pat. No. 6,831,574, a first set of modules 203, 205, 206 and 207 and the corresponding paths (of FIG. 2 herein) could replace the first set of convolutional codes 700, and/or a second set of modules 203, 205, 206 and 207 and the corresponding paths could replace the second set of convolutional codes 710, and/or a third set of modules 203, 205, 206 and 207 and the corresponding paths could replace the set of block codes 720. Thus, any combination of convolutional and/or block decoding can be implemented in a targeted fashion as described herein.

Another MUD processing technique that can be used in conjunction with MUD module 105 is described in previously incorporated U.S. Pat. No. 6,967,598, filed 5 Apr. 2004 and titled "Reduced Complexity Multi-Turbo Multi-User Detector." Here, a first set of modules 203, 205, 206 and 207 and the corresponding paths (e.g., 107, 108, and 109) in the "lower" part of the turbo loop shown in FIG. 2 herein could replace the bank of single user decoders 230, and/or a second set of modules 203, 205, 206 and 207 and the corresponding paths could replace the bank of block decoders 240, shown in FIG. 2 of U.S. Pat. No. 6,967,598. Also, a first set of modules 203, 205, 206 and 207 and the corresponding paths could replace the bank of single user decoders 310, and/or a second set of modules 203, 205, 206 and 207 and the corresponding paths could replace the bank of block decoders 320, shown in FIGS. 3a and 3b of U.S. Pat. No. 6,967,598. Also, and referring to FIG. 4 of U.S. Pat. No. 6,967,598, a first set of modules 203, 205, 206 and 207 and the corresponding paths (of FIG. 2 herein) could replace the bank of decoders 465, and/or a second set of modules 203, 205, 206 and 207 and the corresponding paths could replace the bank of decoders 470. Also, and referring to FIG. 7 of U.S. Pat. No. 6,967,598, a first set of modules 203, 205, 206 and 207 and the corresponding paths (of FIG. 2 herein) could replace the bank of decoders 605, a second set of modules 203, 205, 206 and 207 and the corresponding paths could replace the bank of decoders 465, and/or a third set of modules 203, 205, 206 and 207 and the corresponding paths could replace the bank of decoders 470. Again, any combination of convolutional and/or block decoding can be implemented in a targeted fashion as described herein.

Numerous other realizations of MUD and corresponding architectures can be used here to implement or otherwise complement the performance MUD module 105, as will be apparent in light of this disclosure.

Interleavers and de-interleavers can also be added to the receiver if necessary, to complement interleaving performed by the transmitter. When the transmitter employs interleaving, it changes the presentation of the transmitted values but not the values themselves. IS-95 CDMA (code division multiple access) is one example standard that uses interleaved signals. In a configuration employing interleaving, the MUD detector 105 would pass soft decisions in the form of reliability, or confidence measures to a de-interleaver configured on path 107. The reliability/confidence measures are then passed on in shuffled form to the sorting module 207 of the targeted ECC 201. Shuffling refers to same values but changes the placement or presentation of the values. An interleaver configured on path 108 would perform interleaving. The time-shuffled conditional probabilities would then be input back to the MUD module 105. FIG. 2 of previously incorporated U.S. Pat. No. 6,704,376 demonstrates an example configuration employing interleaving.

Note that each of the modules discussed in reference to FIG. 2 can be implemented in hardware, software, firmware, or some combination thereof. For example, each module can be implemented as a set of instructions or codes executing on one or more digital signal processors or other suitable processing environment. Alternatively, the functionality of each module can be integrated into a purpose built integrated circuit or chip set, such as an FPGA, ASIC, or other system-on-a chip designs. Further note that although the modules are depicted as separate for purposes of discussion, some embodiments may combine the functionality of various modules. For instance, one embodiment combines the modules of the targeted ECC 201 (modules 203, 205, 206, and 207) into a single module or integrated circuit. Numerous implementation details will be apparent in light of this disclosure.

Methodology

Figure 3A:
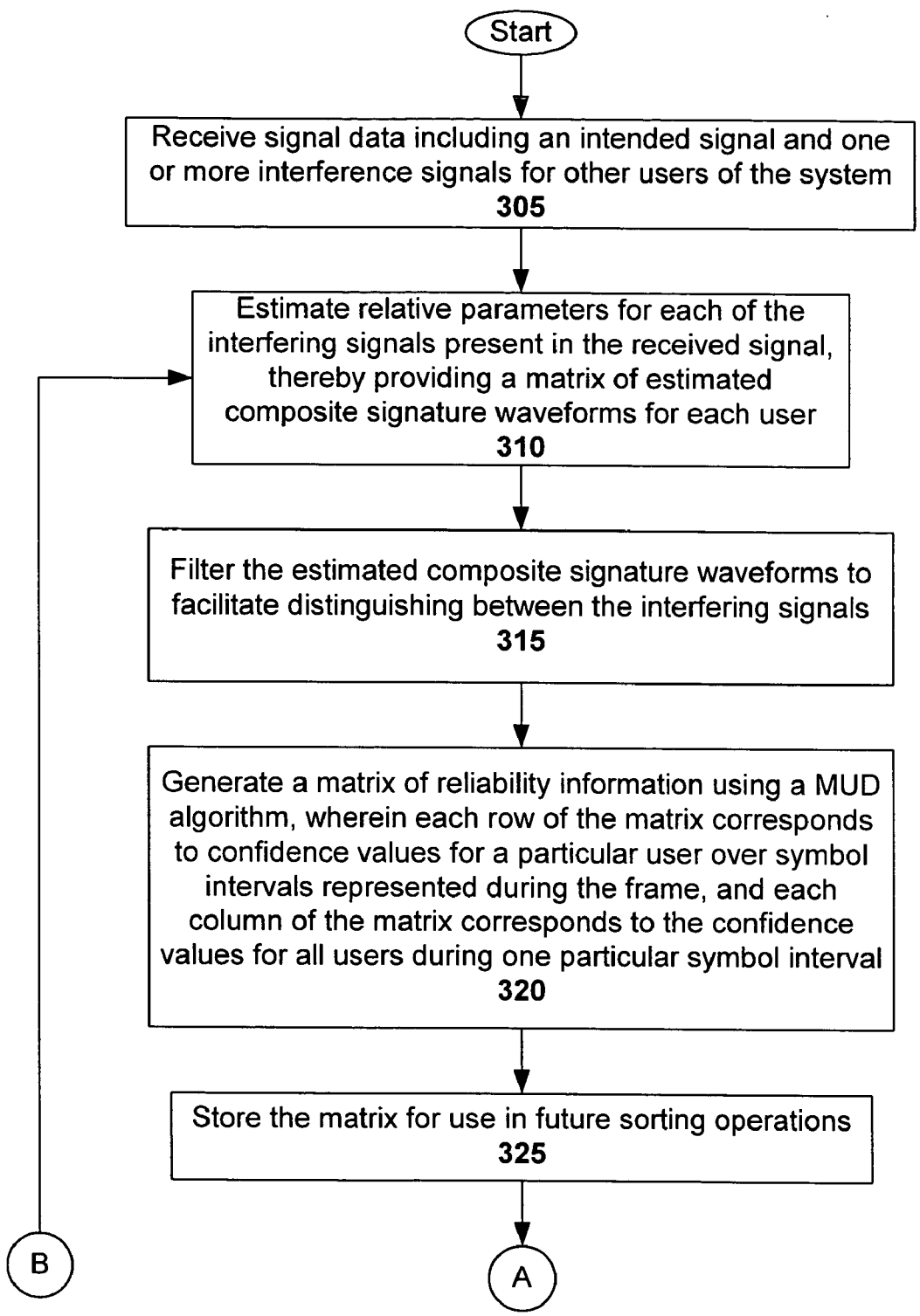
FIGS. 3a and 3b illustrate a method for performing targeted MUD/ECC receiver processing in a multiple access system configured in accordance with an embodiment of the present invention.
Figure 3B:
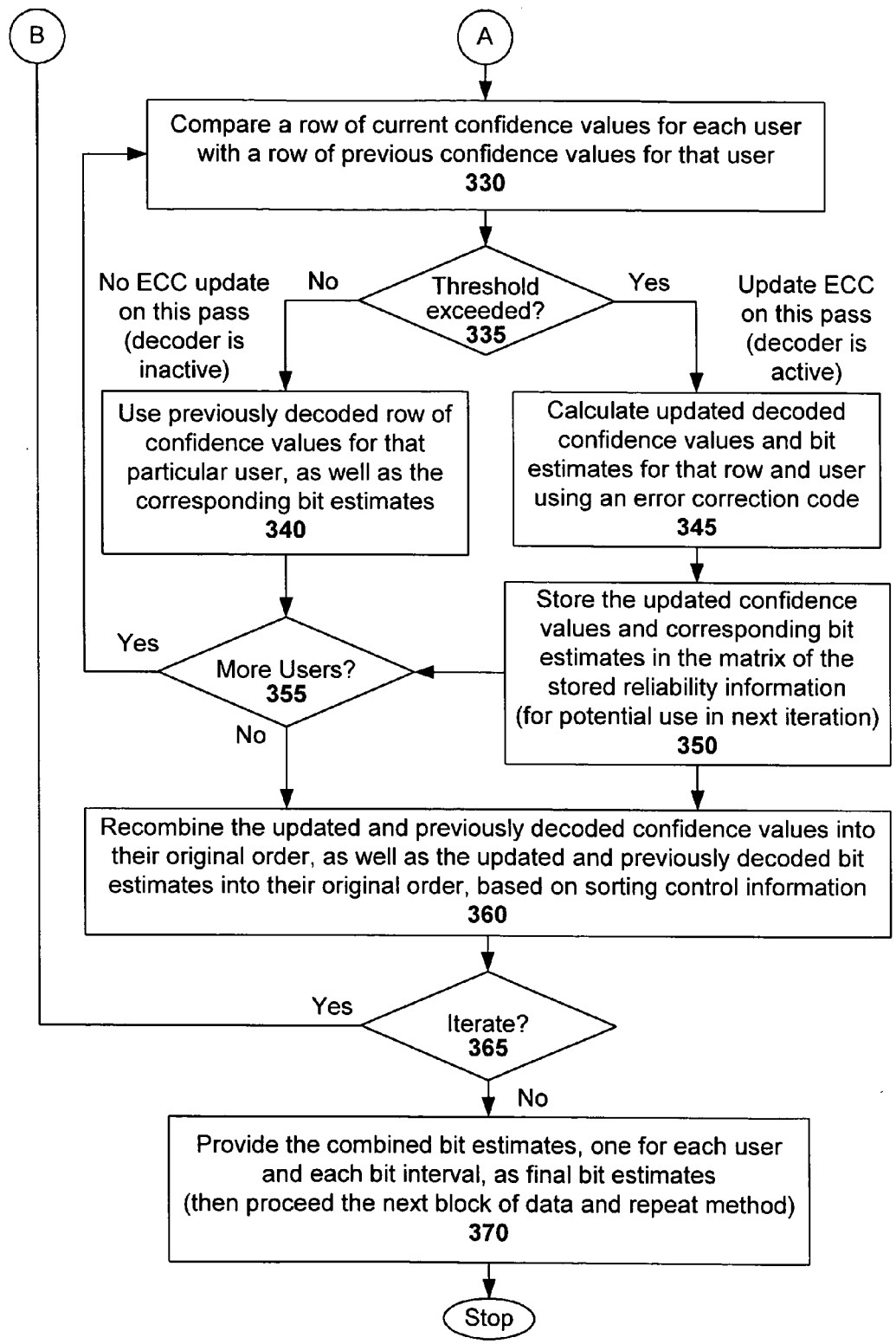

FIGS. 3a and 3b illustrates a method for performing targeted MUD/ECC receiver processing in an overloaded multiple access system that has error correction coding enabled, in accordance with an embodiment of the present invention. The method allows for "targeting" the ECC processing to only particular users, while retaining the estimates of all users for future potential MUD and ECC estimate updates. Computational complexity normally associated with decoding in various MUD solutions is therefore reduced without causing degradation in quality of service or decreasing the total throughput. Reduced complexity and/or targeted MUD processing techniques can be used in conjunction with the targeted ECC processing to further reduce processing complexity, thereby enabling real-time receiver processing. The method can be carried out, for example, by the receiver discussed in reference to FIG. 2. Alternatively, the method can be embodied in a set of instructions encoded on one or more processor readable mediums (e.g., disks or memory chip)

The method begins with receiving 305 a frame of signal data including an intended signal and one or more interfering signals for other users of the system. The method proceeds with estimating 310 relative parameters (e.g., received timing offsets, phases, received amplitudes, and multipath structure) for each of the interfering signals present in the received signal, thereby providing a matrix of estimated composite signature waveforms for each user. The method may further include filtering 315 (e.g., with matched filter bank) the estimated composite signature waveforms to facilitate distinguishing between the interfering signals.

The method proceeds with generating 320 a matrix of reliability information using a MUD algorithm, wherein each row of the matrix corresponds to confidence values for a particular user over symbol intervals represented during the frame, and each column of the matrix corresponds to the confidence values for all users during one particular symbol interval. As previously explained in reference to FIG. 2, any suitable multiuser interference mitigation algorithms (e.g., optimal or reduced complexity MUD) can be used here. The method further includes storing 325 the matrix for use in future operations (e.g., sorting and recombining). The corresponding bit estimates for each user can be stored as well.

The method continues with comparing 330 a row of current confidence values for a user with a row of previous confidence values for that user. In response to determining 335 (based on the comparison) that a change in confidence values for a particular user does not exceed a threshold, either on a per-element basis or across the row in aggregate, then the method continues with using 340 a previously decoded row of confidence values for that particular user, as well as the corresponding bit estimates. In this case, the corresponding single user decoder is "inactive" for the current iteration, and no ECC updates will take place.

In response to determining 335 (based on the comparison) that a change in confidence values for a particular user exceeds the threshold, then the method continues with calculating 345 an updated decoded row of confidence values for that particular user using an error correction code (ECC). In this case, the corresponding single user decoder is "active" for the current iteration, and ECC updates will take place. In more detail, the activated single user decoders calculate conditional probabilities, one for each decoded symbol of each user associated with an active decoder, and output those conditional probabilities as confidence values. Additionally, the corresponding bit estimates are calculated and output. As previously explained in reference to FIG. 2, any suitable ECC algorithm can be used here.

The method continues with storing 350 the updated decoded row of confidence values and the corresponding bit estimates in the previously stored reliability matrix (for potential use in the next iteration). The method continues with determining 355 if there are more users to process. If so, the steps 330 through 350 are repeated for each user represented in the current frame of data. Otherwise, the method continues with recombining 360 the updated and previously decoded confidence values into their original order, as well as the updated and previously decoded bit estimates into their original order, based on sorting control information. Recall that sorting control information includes a list that tracks which users were passed to the partially activated bank of decoders, and which users do not undergo decoding on the current iteration (those users associated with "inactive" decoders). The method then continues with determining 365 if further iteration is required. As previously explained, various rules of iteration can be used here.

If no further iteration is necessary, then the method continues with providing 365 the combined bit estimates, one for each user and each bit interval, as the final estimates of what the user sent. Operation then commences for the next frame of data, repeating the described receiver processes. Otherwise, if further iteration is required, then the method continues with subjecting the combined confidence values to additional processing (e.g., repeating steps 310 to 360). Iteration continues as described until the stopping criteria is met, and then the final estimates are provided, and processing begins for the next frame of received data. Note that non-iterating embodiments would simply involve one pass through the method.

Note that embodiments of the present invention are described herein in the context of an overloaded or supersaturated multiple access system. However, it will be appreciated in light of this disclosure that the present invention will also operate in underloaded and fully loaded environments. In contrast, conventional MUD schemes may work for under-loaded or fully-loaded systems, but generally break down as soon as there is one more user than a fully loaded system. Further note that the invention does not require the received signals to correspond to any particular multiple access scheme, or any limitation to wireless processing. For example, the present invention operates in the same manner on any set of digitally modulated interfering signals, whether those signals were provided by cellular CDMA systems, TDMA systems, FDMA systems, a storage medium, wired multiple access systems such a cable modems, wireless local area network systems, or other such multiple access systems.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method for performing real-time receiver processing in a multiple access system that has error correction coding enabled, the method comprising:
   receiving a block of signal data including an intended signal and one or more interfering signals for other users of the system;
   generating reliability information using a multiuser interference mitigation algorithm, the reliability information including confidence values for each user represented during the block;
   comparing current confidence values for a user with previous confidence values for that user; and
   in response to the comparison indicating a change in confidence values for the user does not exceed a threshold, using previously decoded confidence values and corresponding bit estimates for that user, thereby reducing error correction coding complexity.

2. The method of claim 1 further comprising:
   in response to the comparison indicating a change in confidence values for the user exceeds the threshold, calculating updated decoded confidence values and corresponding bit estimates for the user using an error correction code.

3. The method of claim 2 further comprising:
   updating a previously stored matrix of reliability information to include the updated decoded confidence values and the corresponding bit estimates.

4. The method of claim 2 further comprising:
   recombining the updated decoded confidence values and previously decoded confidence values into their original order, and recombining the updated decoded bit estimates and previously decoded bit estimates into their original order, thereby providing combined confidence values and combined bit estimates.

5. The method of claim 4 wherein in response to no further iteration being required, the method further includes providing the combined bit estimates as final estimates.

6. Tube method of claim 5 wherein the method repeats for one or more additional blocks of signal data.

7. The method of claim 4 wherein in response to further iteration being required, the method further includes subjecting the combined confidence values to additional processing through the multiuser interference mitigation algorithm.

8. The method of claim 7 wherein the method repeats until a rule of iteration is satisfied.

9. The method of claim 1 wherein there is no iteration through the multiuser interference mitigation algorithm.

10. The method of claim 1 further comprising:
    repeating the comparing and using for each user represented during the block.

11. The method of claim 1 further comprising at least one of:
    estimating relative parameters for each of the interfering signals present in the received signal, thereby providing a matrix of estimated composite signature waveforms for each user to the multiuser interference mitigation algorithm;
    filtering the estimated composite signature waveforms to facilitate distinguishing between the interfering signals by the multiuser interference mitigation algorithm; and
    interleaving and de-interleaving based on a transmitter-based interleaving scheme.

12. The method of claim 1 further comprising:
    storing a matrix of reliability information and corresponding bit estimates for use in future operations.

13. The method of claim 1 wherein the multiuser interference mitigation algorithm is a reduced complexity multiuser detection (MUD) algorithm.

14. The method of claim 1 wherein the multiuser interference mitigation algorithm is a multiuser detection (MUD) algorithm that operates in conjunction with at least one of interleaving, confidence ordering, and voting schemes to reduce MUD processing complexity.

15. A method for performing real-time receiver processing in a multiple access system that has error correction coding enabled, the method comprising:
    receiving a frame of signal data including an intended signal and one or more interfering signals for other users of the system;
    generating a matrix of reliability information using a multiuser detection (MUD) algorithm, wherein each row of the matrix corresponds to confidence values for a particular user over symbol intervals represented during the frame, and each column of the matrix corresponds to the confidence values for all users during one particular symbol interval;
    comparing a row of current confidence values for a user with a row of previous confidence values for that user; and
    in response to the comparison indicating a change in confidence values for the user does not exceed a threshold, using a previously decoded row of confidence values and corresponding bit estimates for that user, thereby reducing error correction coding complexity.

16. The method of claim 15 further comprising:
    in response to the comparison indicating a change in confidence values for the user exceeds the threshold, calculating updated decoded confidence values and corresponding bit estimates for the user using an error correction code.

17. The method of claim 16 wherein sorting control information is available that defines for a current iteration which users are associated with previously decoded confidence values and bit estimates, and which users are associated with updated decoded confidence values and bit estimates, the method further comprising:
    recombining the updated decoded confidence values and previously decoded confidence values into their original order, and recombining the updated decoded bit estimates and previously decoded bit estimates into their original order, thereby providing combined confidence values and combined bit estimates, wherein the recombining is based on the sorting control information.

18. The method of claim 17 where the method further comprises:
    in response to no further iteration being required, providing the combined bit estimates as final estimates; and
    in response to further iteration being required, subjecting the combined confidence values to additional processing through the MUD algorithm.

19. A system for performing real-time receiver processing in a multiple access system that has error correction coding enabled, the system comprising:
    a multiuser interference mitigation module configured for generating reliability information including confidence values for each user represented during a block of received signal data including an intended signal and one or more interfering signals for other users of the system;
    a sorting module adapted for comparing current confidence values for a user with previous confidence values for that user;
    wherein in response to the comparison indicating a change in confidence values for the user does not exceed a threshold, previously decoded confidence values and corresponding bit estimates are used for the user, thereby reducing error correction coding complexity.

20. The system of claim 19 wherein in response to the comparison indicating a change in confidence values for the user exceeds the threshold, updated decoded confidence values and corresponding bit estimates are calculated for the user using an error correction code.

21. The system of claim 20 further comprising:
    a recombining module adapted for recombining the updated decoded confidence values and previously decoded confidence values into their original order, and recombining the updated decoded bit estimates and previously decoded bit estimates into their original order, thereby providing combined confidence values and combined bit estimates.

22. The system of claim 21 wherein in response to no further iteration being required, the recombining module is further adapted to provide the combined bit estimates as final estimates.

23. The system of claim 21 wherein in response to further iteration being required, the recombining module is further adapted to provide the combined confidence values to the multiuser interference mitigation module for additional processing until a rule of iteration is satisfied.

24. The system of claim 19 wherein there is no iteration through the multiuser interference mitigation module.

25. The system of claim 19 further comprising at least one of:
    a parameter estimating module adapted for estimating relative parameters for each of the interfering signals present in the received signal, thereby providing a matrix of estimated composite signature waveforms for each user to the multiuser interference mitigation module;
    a filter for filtering the estimated composite signature waveforms to facilitate distinguishing between the interfering signals by the multiuser interference mitigation module;
    an interleaver module for interleaving signals provided to the multiuser interference mitigation module based on a transmitter-based interleaving scheme; and
    a de-interleaver module for de-interleaving signals from the multiuser interference mitigation module based on the transmitter-based interleaving scheme.

26. The system of claim 19 further comprising:
a storage module for storing at least one of reliability information and corresponding bit estimates.

27. The system of claim 19 wherein the multiuser interference mitigation module is a reduced complexity multiuser detection (MUD) module.

28. The system of claim 19 wherein the multiuser interference mitigation module is a multiuser detection (MUD) module that operates in conjunction with at least one of interleaving, confidence ordering, and voting schemes to reduce MUD processing complexity.

29. A processor readable medium containing processor-executable instructions for performing real-time receiver processing in a multiple access system that has error correction coding enabled, the processor-executable instructions comprising instructions for:
receiving reliability information generated by a multiuser interference mitigation module, the reliability information including confidence values for each user represented during a block of received signal data including an intended signal and one or more interfering signals for other users of the system; comparing current confidence values for a user with previous confidence values for that user; and
in response to the comparison indicating a change in confidence values for the user does not exceed a threshold, using previously decoded confidence values and corresponding bit estimates for that user, thereby reducing error correction coding complexity.

30. The processor readable medium of claim 29 wherein in response to the comparison indicating a change in confidence values for the user exceeds the threshold, the processor-executable instructions further comprising instructions for:
calculating updated decoded confidence values and corresponding bit estimates for the user using an error correction code;
recombining the updated decoded confidence values and previously decoded confidence values into their original order, and recombining the updated decoded bit estimates and previously decoded bit estimates into their original order, thereby providing combined confidence values and combined bit estimates; and in response to no further iteration being required, providing the combined bit estimates as final estimates.

* * * * *